United States Patent
Cho et al.

(10) Patent No.: US 7,471,854 B2
(45) Date of Patent: Dec. 30, 2008

(54) LASER MODULE ALLOWING DIRECT LIGHT MODULATION AND LASER DISPLAY EMPLOYING THE SAME

(75) Inventors: Soo-haeng Cho, Yongin-si (KR); Gi-bum Kim, Yongin-si (KR); Taek Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 64 days.

(21) Appl. No.: 11/785,306

(22) Filed: Apr. 17, 2007

(65) Prior Publication Data

US 2008/0031289 A1 Feb. 7, 2008

(30) Foreign Application Priority Data

Aug. 2, 2006 (KR) .................. 10-2006-0072928

(51) Int. Cl.
  *G02F 1/295* (2006.01)
(52) U.S. Cl. .......................... 385/10; 385/93
(58) Field of Classification Search ............ 385/10, 385/93
  See application file for complete search history.

(56) References Cited

U.S. PATENT DOCUMENTS

| 7,322,704 | B2 * | 1/2008 | Shchegrov | 353/94 |
| 2006/0280219 | A1 * | 12/2006 | Shchegrov | 372/99 |
| 2007/0147444 | A1 * | 6/2007 | Kim | 372/22 |

* cited by examiner

*Primary Examiner*—Frank G Font
*Assistant Examiner*—Eric Wong
(74) *Attorney, Agent, or Firm*—Harness, Dickey & Pierce, P.L.C.

(57) ABSTRACT

Provided are a laser module allowing direct light modulation and a laser display employing the laser module. The laser module may include a semiconductor chip, a Volume Bragg Grating (VBG), a pump laser and a non-linear optical element. The semiconductor chip includes an active layer generating light of primary wavelength and a reflective layer providing the generated light to a cavity and reflecting the light within the cavity. The VBG may output light repeatedly reflected between the reflective layer and the VBG. The non-linear optical element disposed outside a cavity between the semiconductor chip and the VBG may convert the light of a first wavelength emitted from the active layer into light of a second wavelength different from the first wavelength. The laser module having the above-mentioned construction uses an external cavity laser and a non-linear optical element to achieve direct light modulation.

21 Claims, 7 Drawing Sheets

FIG. 8

# LASER MODULE ALLOWING DIRECT LIGHT MODULATION AND LASER DISPLAY EMPLOYING THE SAME

PRIORITY STATEMENT

This application claims the benefit of Korean Patent Application No. 10-2006-0072928, filed on Aug. 2, 2006, in the Korean Intellectual Property Office, the entire contents of which is incorporated herein by reference.

BACKGROUND

1. Field

Example embodiments relate to a laser module and a laser display employing the laser module. More particularly, example embodiments relate to a laser module allowing direct light modulation by combining an external cavity laser with a non-linear optical element and a laser display employing the laser module.

2. Description of the Related Art

Conventionally, to create visible light having a relatively low power of about 107 mW, a Distributed Feedback (DFB) or Nd:YAG laser is used to generate infrared (IR) light. The IR light is then coupled to a periodically-poled second harmonic generation (PP-SHG) material.

However, a complicated optical system is typically required to couple a 1060 nm DFB laser into an SHG waveguide at least because the 1060 nm DFB laser has a large divergence angle and an asymmetric optical profile. Thus, the laser becomes bulky and relatively large coupling losses tend to occur. Furthermore, if the 1,060 nm DFB laser is used for direct light modulation, the direct light modulation generally cannot be practically and/or effectively achieved because (i) the wavelength of optically modulated light is generally not uniform due to its thermal instability and (ii) IR light of a wavelength of about 1,060 nm generated by a DFB laser has a relatively low output power.

Further, an Nd:YAG laser generally cannot achieve direct light modulation because an Nd:YAG laser generally has a very low modulation speed.

Conventionally, because neither a DFB laser nor a Nd:YAG laser can achieve direct light modulation without an Acousto-Optic Modulator (AOM) and an AOM driving circuit, an AOM and AOM driving circuit are used and/or required if the DFB or Nd:YAG laser is used in a display requiring optical intensity modulation. The use of the AOM and AOM driving circuit causes difficulties when it comes to providing compact displays.

SUMMARY

Example embodiments provide a laser module designed to allow direct light modulation and a laser display employing the laser module.

An example embodiment provides a laser module allowing direct light modulation. The laser module may include a semiconductor chip including an active layer generating light of primary wavelength and a reflective layer reflecting outwards the light generated in the active layer; a Volume Bragg Grating (VBG) that is disposed opposite the active layer and repeatedly reflects light emitted from the active layer toward the reflective layer to amplify light and outputs the amplified light; a pump laser supplying pump light in order to excite the active layer; and a non-linear optical element disposed outside of the VBG in a cavity and converts light of primary wavelength emitted from the active layer into light of a different wavelength than the primary wavelength.

According to an example embodiment, the pump laser may be disposed behind the semiconductor chip.

According to an example embodiment, the laser module may include a heat sink mounted on a rear surface of the semiconductor chip.

According to an example embodiment, the non-linear optical element may be formed of a Periodically-Poled Second Harmonic Generation (PP-SHG) material and may have a waveguide shape.

According to an example embodiment, the primary wavelength is within a range of about 900 nm to about 1,300 nm and light output through the non-linear optical element is within a range of about 450 to about 650 nm.

Another example embodiment provides a laser display for displaying an image by scanning laser light onto a screen. The laser display may include a laser module outputting optically modulated light; a light scanning unit scanning the laser light emitted by the laser module to the screen; a projection optical system that is disposed between the laser module and the screen and enlarges and projects laser light onto the screen. The laser module included in the laser display may include a semiconductor chip including an active layer generating light of primary wavelength and a reflective layer reflecting outwards the light generated in the active layer; a VBG that is disposed opposite the active layer and repeatedly reflects light emitted from the active layer toward the reflective layer to amplify light and outputs the amplified light; a pump laser supplying pump light in order to excite the active layer; and a non-linear optical element that is disposed outside a cavity between the semiconductor chip and the VBG and converts the light of primary wavelength emitted from the active layer into light of a different wavelength than the primary wavelength.

Still another example embodiment provides a laser module. The laser module may include a semiconductor chip arranged at a first end of a cavity, the semiconductor chip including an active layer generating light of a primary wavelength and a reflective layer providing the light to the cavity; a grating arranged at a second end of the cavity, the grating outputting amplified light created by the light being repeatedly reflected between the grating and the reflective layer; and a non-linear optical element disposed outside the cavity, the non-linear optical element converting the amplified light of the primary wavelength into light of a different wavelength.

BRIEF DESCRIPTION OF THE DRAWINGS

The above and other features, aspects and advantages of example embodiments will become more apparent from a review of the detailed description that refers to the attached drawings in which.

DETAILED DESCRIPTION OF EXAMPLE EMBODIMENTS

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough and complete. In the drawings, like numbers refer to like elements throughout.

Figure 1:
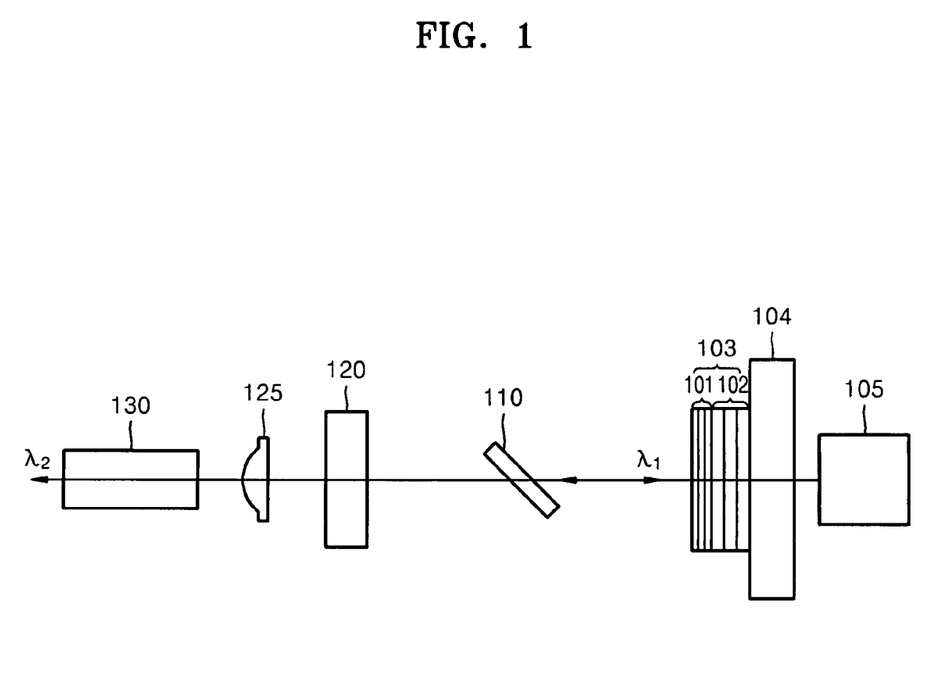
FIG. 1 is a diagram illustrating the construction of an example embodiment of a laser module allowing direct light modulation.

Referring to FIG. 1, an example embodiment of a laser module may include a semiconductor chip 103, a pump laser 105, a Volume Bragg Grating (VBG) 120 and a non-linear optical element 130. The semiconductor chip emits light of a desired and/or predetermined wavelength, and the pump laser 105 supplies pump light to the semiconductor chip 103. In FIG. 1, the VBG 120 is separated from the semiconductor chip 103 and is arranged to reflect light emitted by the semiconductor chip 103 back towards the semiconductor chip 103. The area between the semiconductor chip 103 and the VBG 120 in FIG. 1 is referred to as a cavity. As such, the non-linear optical element 130 is disposed outside of the cavity. The non-linear optical element 130 is configured to convert light of a desired and/or predetermined wavelength radiated from the VBG 120 into light of a different wavelength.

According to an example embodiment, the semiconductor chip 103 includes an active layer 102 emitting light of a desired and/or predetermined wavelength and a reflective layer 101 reflecting light generated in the active layer 102 out of the semiconductor chip 103. As is well-known in the art, the active layer 102 contains a quantum well layer having a Resonant Periodic Gain (RPG) structure including quantum wells with barrier layers between the quantum wells. For example, the quantum well layer may be formed of at least one semiconductor material selected from the group including $In_xGa_{(1-x)}As_yP_{(1-y)}$, $In_xGa_{(1-x)}As$, $In_xGa_{(1-x)}N_yAs_{(1-y)}$, and $In_xGa_{(1-x)}As_ySb$ ($0.0<x<1.0$ and $0.0<y<1.0$). Further, the quantum well layer may be made of at least one semiconductor material selected from the group including $Al_xGa_{(1-x)}As$ ($0 \leq x \leq 0.3$) and $GaAs_{(1-y)}P_y$ ($0 \leq y \leq 0.3$). Primary light generated by the semiconductor chip 103 having the above-mentioned structure has a wavelength within the range of about 900 nm to 1,300 nm.

The reflective layer 101 may be a Distributed Bragg Reflector (DBR) layer. The reflective layer 101 may include a sequence of alternating layers of two semiconductor materials with different refractive indices, each of which has a thickness of about one quarter of the wavelength of primary light ($\lambda_2/4$). For example, a DBR layer reflecting primary light and transmitting pump light may be formed by alternating $Al_xGa_{(1-x)}As$ and $Al_yGa_{(1-y)}As$ layers ($0 \leq x$, $y \leq$, $x \neq y$) having a thickness of about $\lambda_2/4$.

According to an example embodiment, the laser module may further include a heat sink 104. The heat sink 104 may be mounted on, for example, a rear surface of the semiconductor chip 103 to dissipate heat generated in the active layer 102 as shown in FIG. 1.

The active layer 102 may be excited in order to emit light once the active layer 102 absorbs pump light emitted by the pump laser 105. To obtain a gain, each quantum well of the quantum layer is positioned at an anti-node of a standing wave created when light generated in the active layer 102 resonates between the VBG 120 and the reflective layer 101 of the semiconductor chip 103. The light generated in the active layer 102 may be amplified as the light repeatedly reciprocates between the VBG 120 and the reflective layer 101.

As shown in FIG. 1, the pump laser 105 may be disposed behind the semiconductor chip 103 and the heat sink 104. The heat sink 104, which may be disposed on the rear surface of the semiconductor chip 103 transmits pump light of a desired and/or predetermined wavelength emitted by the pump laser 105 and dissipates heat generated in the active layer 103. To achieve this function, the heat sink 104 may be formed of a material that provides high heat dissipation and is optically transparent to pump light. Examples of such material include diamond, silicon carbide (SiC), sapphire, aluminum nitride (AlN), and gallium nitride (GaN).

When the pump laser 105 is disposed behind the semiconductor chip 103 as shown in FIG. 1, the fabrication process may be simplified. Thus, high volume production and compact design laser modules may be achieved in an example embodiment in which the pump laser 105 is disposed behind the semiconductor chip 103. However, according to another example embodiment, the pump laser 105 may be disposed in a different location. For example, variations are considered in which the pump laser 105 may be arranged laterally in front of the semiconductor chip 103.

According to an example embodiment, the wavelength of pump light is less than the wavelength of light generated in the active layer 102 so that the active layer 102 may be excited by the pump light. For example, when the active layer 102 generates light having a wavelength of about 920 nm or about 1,060 nm in the infrared (IR) region, the pump light may have a wavelength $\lambda_1$ of about 808 nm. Because it is difficult to uniformly inject carriers into a large area using electrical pumping, optical pumping is generally used to obtain high output power according to an example embodiment.

The VBG 120 controls the wavelength of light emitted by the semiconductor chip 103 in an example embodiment of a laser module. That is, the VBG 120 transmits primary light of a desired and/or predetermined wavelength while reflecting light of a different wavelength back to the semiconductor chip 103. While example embodiments described herein include a VBG 120, it will be appreciated that a Volume Holographic Grating (VHG) may be used instead of the VBG 120.

An example embodiment of a laser module may also include a Brewster plate 110 disposed between the semiconductor chip 103 and the VBG 120. The Brewster plate 110 may improve polarization characteristics to increase efficiency of coupling with the periodically poled (PP) structure of the non-linear optical element 130. As shown in FIG. 1, the Brewster plate 110 is disposed obliquely on an optical axis. In particular, the Brewster plate 110 is arranged such that that light is incident at a Brewster's angle. When the Brewster plate 110 is used, optical-axis arrangement is easily achieved by placing the Brewster plate 110 at a Brewster's angle.

An example embodiment of a laser module may also include a polarization coating and/or epitaxial layer formed on the semiconductor chip 103 to control the polarization of light. Accordingly, a polarization coating and/or epitaxial layer formed on the semiconductor chip may be used instead of the Brewster plate 110.

In FIG. 1, the non-linear optical element 130 is disposed outside of the cavity between the VBG 120 and the semiconductor chip 103. The non-linear optical element 130 may convert light of a first wavelength emitted by the semiconductor chip 103 into light of a different wavelength. According to an example embodiment, the non-linear optical element 130 converts light having a wavelength within the infrared (IR) region emitted by the semiconductor chip 103 into light having a wavelength within the visual region. For example, the non-linear optical element 130 converts light emitted by the semiconductor chip 103 into half-wavelength light. If the semiconductor chip 103 emits primary light within the range of about 900 nm to about 1,300 nm, the non-linear optical element 130 may convert the primary light into visible light having a wavelength of about 450 nm to about 650 nm.

According to an example embodiment, the non-linear optical element 130 may be formed of Periodically Poled Secondary Harmonic Generation (PP-SHG) material such as PP LiNbO$_3$ (PPLN) or PP LiTaO$_3$ (PPLT), for example. The non-linear optical element 130 may have a waveguide shape. Further, the non-linear optical element 130 may have high conversion efficiency because the non-linear optical element 130 converts the wavelength of light emitted by an external cavity laser in a single pass.

An example embodiment of a laser module may also include a condensing lens 125 disposed between the non-linear optical element 130 and the VBG 120. The condensing lens 125 increases efficiency of coupling with the non-linear optical element 130 to increase the optical conversion efficiency of the laser module. The condensing lens 125 may be a spherical lens, aspheric lens, or Graded Refractive Index (GRIN) lens, for example.

Figure 2:
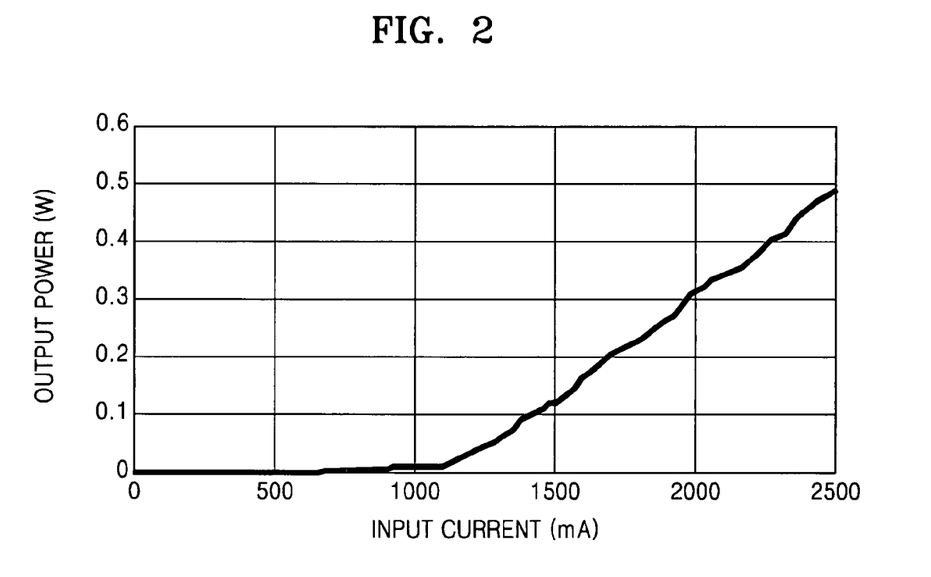
FIG. 2 is a graph illustrating output power with respect to input current of an external cavity laser used in the example embodiment of the laser module of FIG. 1.
Figure 3:
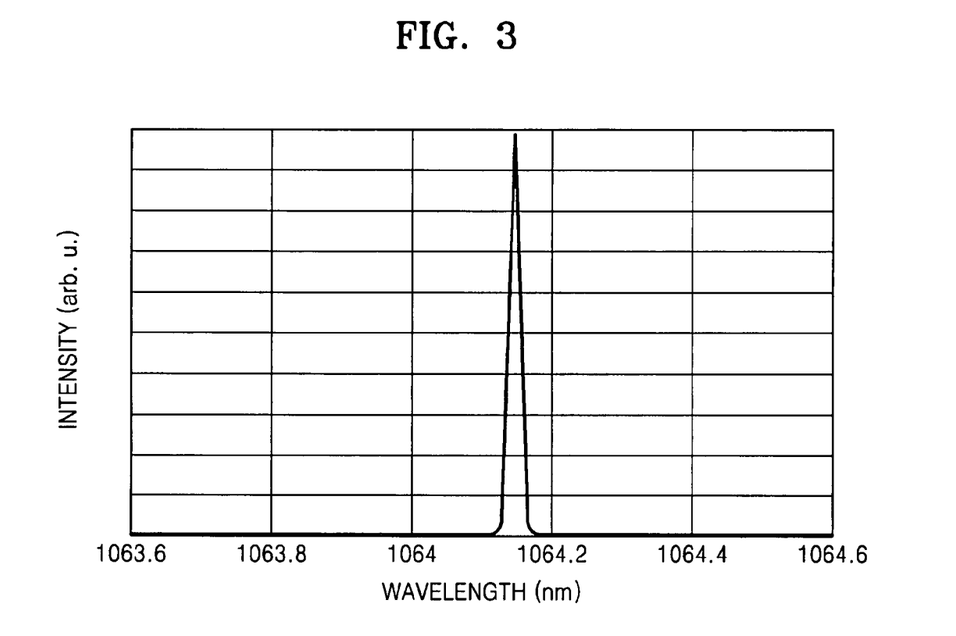
FIG. 3 is a graph illustrating light intensity with respect to wavelength of an external cavity laser using in the example embodiment of the laser module of FIG. 1.

An example embodiment of a laser module may produce high power visible light by coupling high efficiency, high power primary light with the non-linear optical element 130. FIG. 2 is a graph illustrating the power of primary light emitted by an external cavity laser such as a Vertical External Cavity Surface Emitting Laser (VECSEL) relative to input current of the laser module of FIG. 1. As evident from the graph in FIG. 2, the external cavity laser provides high optical efficiency and easy power control. FIG. 3 illustrates light intensity relative to wavelength of the laser module of FIG. 1 including a 5 mm VBG according to an example embodiment. As is evident from FIG. 3, the laser module can obtain primary light having a uniform wavelength that suffers slight variations in temperature or power, unlike a conventional Distributed Feedback laser diode (DFB LD). According to an example embodiment, the wavelength bandwidth of primary light may be increased by adjusting the length of the VBG. In particular, as the length of the VBG increases, the wavelength bandwidth of primary light decreases.

Figure 4:
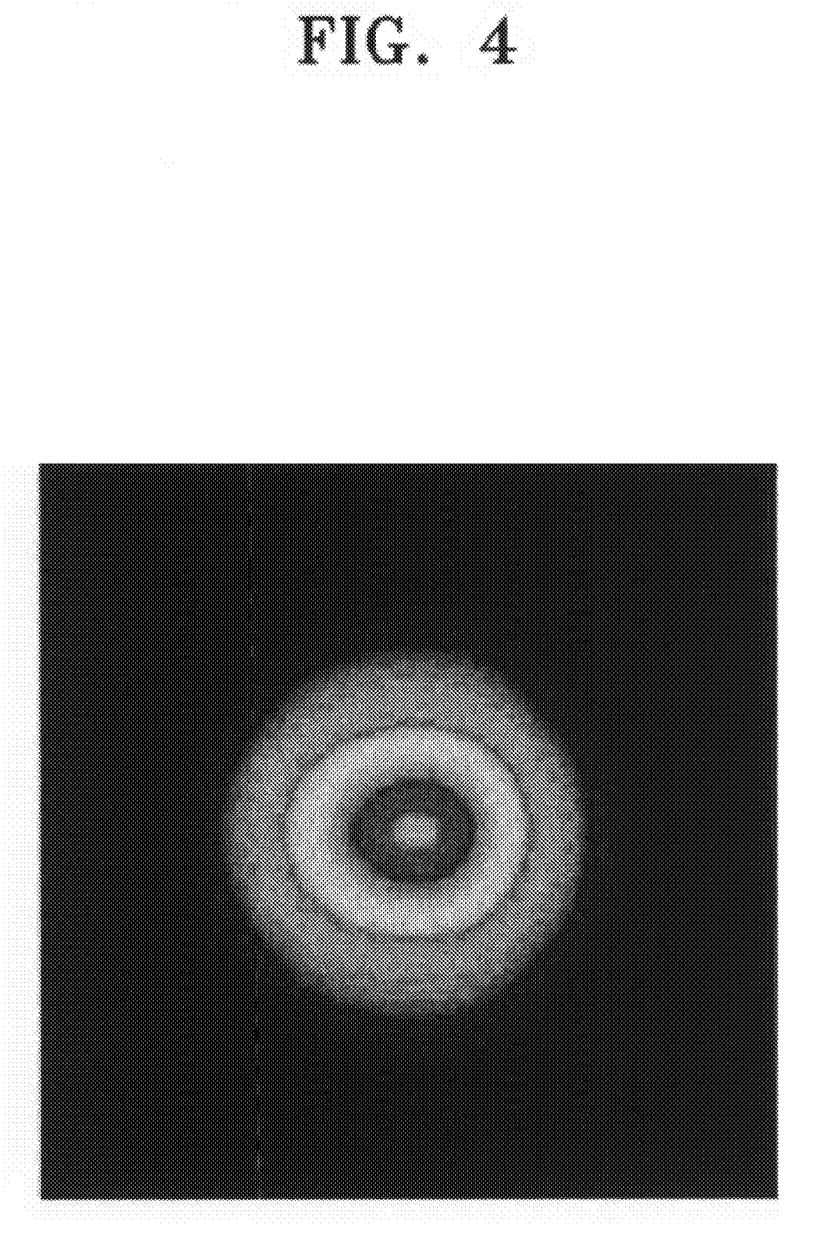
FIG. 4 illustrates the profile of laser light emitted by an external cavity laser used in the example embodiment of the laser module of FIG. 1.

FIG. 4 illustrates an example profile of laser light emitted by an external cavity laser used in the laser module of FIG. 1. As is evident from FIG. 4, unlike light emitted by a conventional DFB LD, light emitted by the external cavity laser has a small divergence angle because the light has a round symmetric profile.

Figure 5:
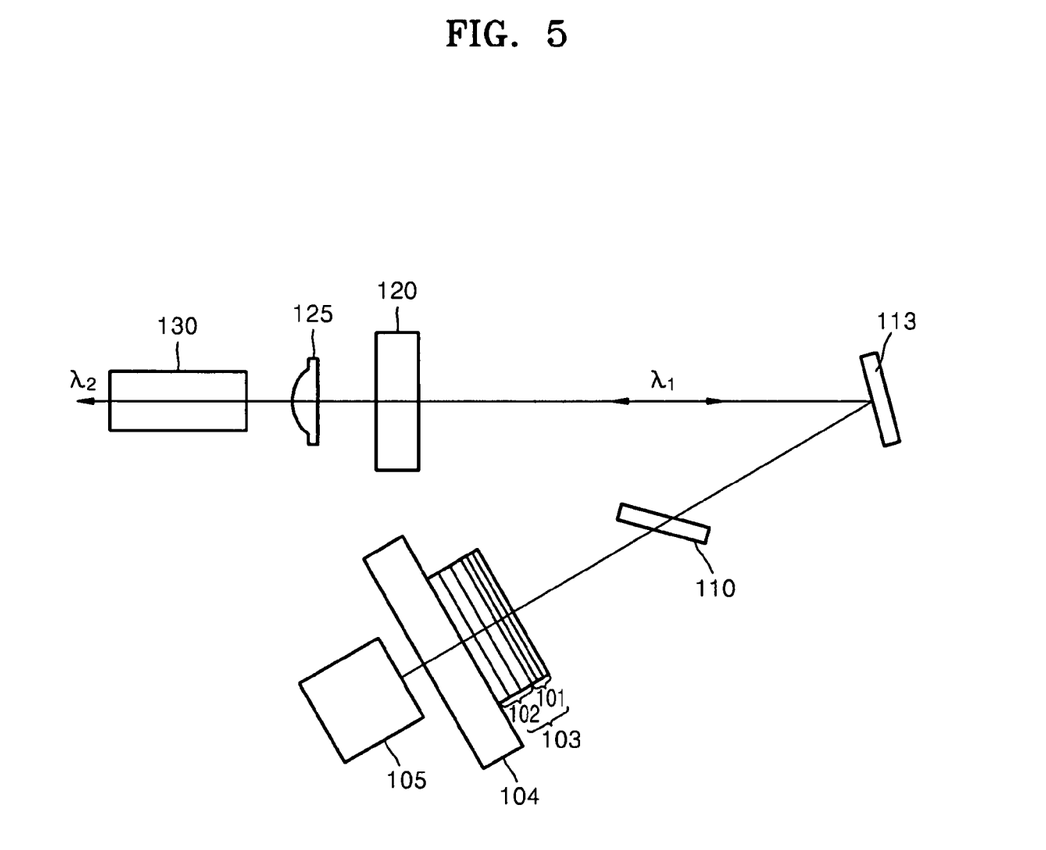
FIG. 5 is a diagram illustrating an example embodiment of a laser module including a folding mirror.

FIG. 5 illustrates an example of a laser module including a folding mirror 113 for converting the path of light according to another example embodiment. As shown in FIG. 5, the folding mirror 113 may be disposed in an optical path between the Brewster plate 110 and the VBG 120, thereby changing the internal arrangement of the laser module.

Figure 6:
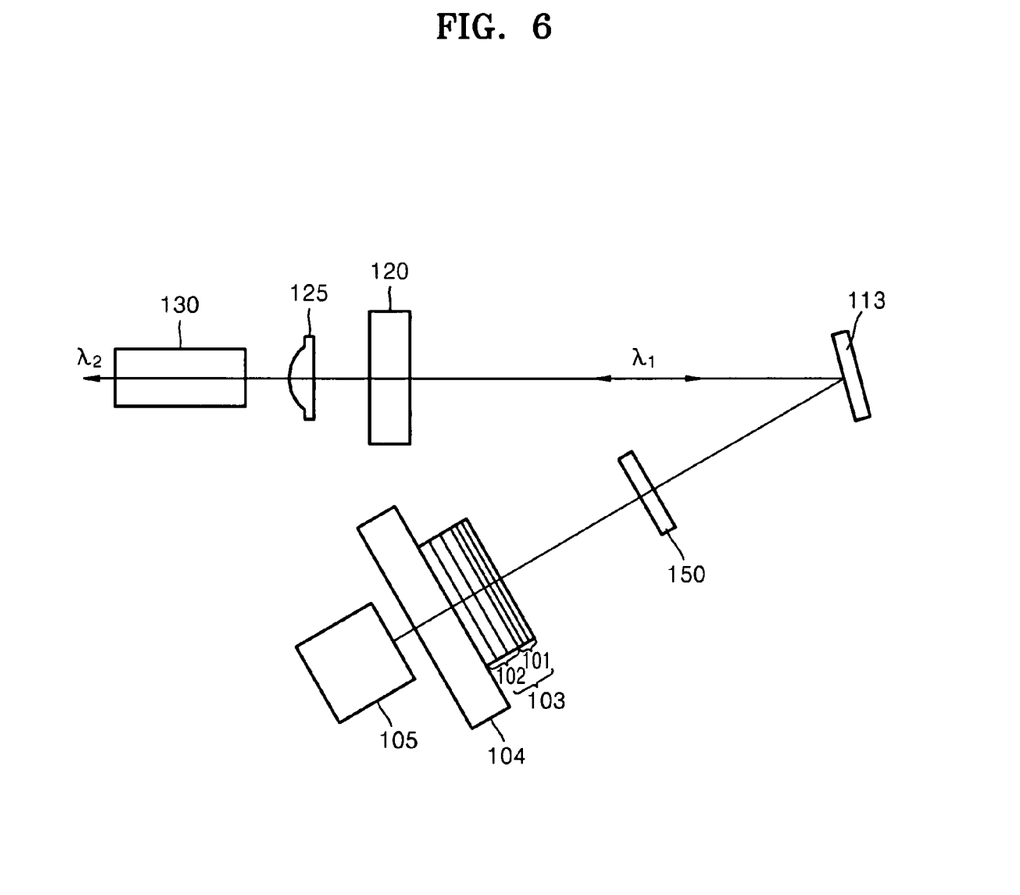
FIG. 6 is a diagram illustrating a modified example embodiment of the laser module of FIG. 5.

FIG. 6 illustrates a modified example of the laser module of FIG. 5. In the example embodiment of FIG. 6, the laser module of FIG. 5 has been modified to include a polarization filter 150 instead of the Brewster plate 110.

The IR-to-visible conversion efficiency of an example embodiment of a laser module when an IR light emitted by the semiconductor chip 103 has an output power of 450 mW is now described. For example, the 450 mW IR light is converted into 321 mW light due to a reduction in wavelength bandwidth of 0.28 nm by a ratio of 0.2. If the wavelength conversion efficiency is 40%, the 321 mW light is converted into half-wavelength light having output power of 128 mW in this example. That is, because 450 mW IR light is converted into 128 mW light in this example, the laser module has an electrical-to-optical conversion efficiency of about 6%, which is significantly greater than an electrical-to-optical conversion efficiency for green light that is less than about 5% at a current level.

The laser module according to an example embodiment uses an external cavity laser and the non-linear optical element 130 to achieve direct light modulation. Thus, when an example embodiment of a laser module providing direct light modulation is used as a light source for a display, an image can be displayed by performing simple light modulation without the need for additional elements for light modulation.

Figure 7:
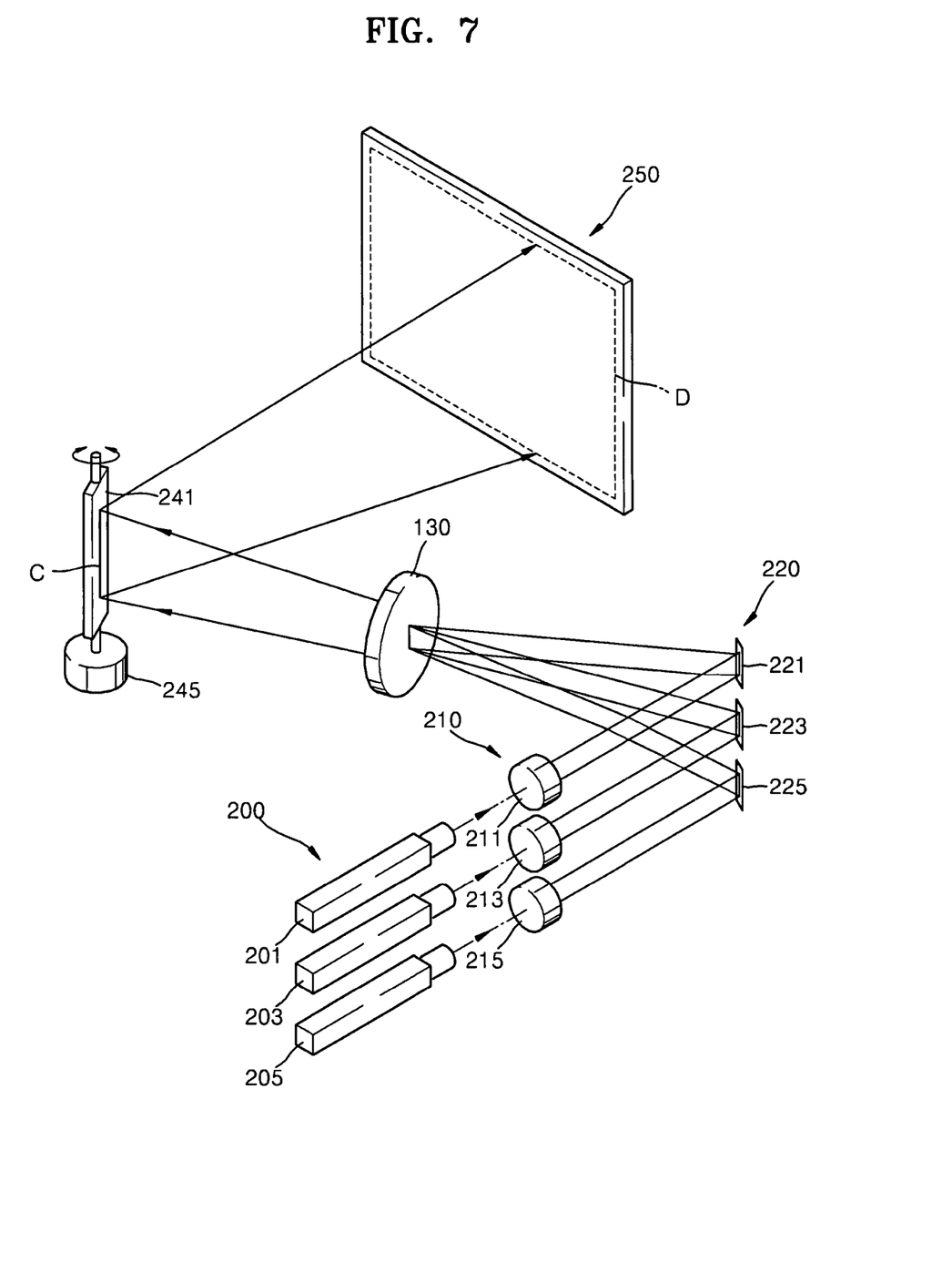
FIG. 7 is a diagram illustrating the optical arrangement of an example embodiment of a laser display employing a laser module allowing direct light modulation according to an example embodiment.

FIG. 7 illustrates the optical arrangement of a laser display employing a laser module allowing direct light modulation according to an example embodiment.

Referring to FIG. 7, the laser display displays an image by scanning laser light to a screen 250. An example embodiment of a laser display may include a laser module 200, a light scanning unit, a projection optical system 230 and a screen 250. The laser module 200 outputs optically modulated laser light. The projection optical system 230 is disposed between the laser module 200 and the screen 250 and enlarges and projects light onto the screen 250.

The example embodiment of the laser module 200 allows direct light modulation as described above with reference to FIGS. 1-6 and outputs laser light corresponding to an image to be projected onto the screen 250. As shown in FIG. 7, the laser module 200 may include first through third laser module units 201, 203, and 205. The first through third laser module units 201, 203 and 205 may output red, blue, and green laser light, respectively, to realize a color display. Although the example shown in FIG. 7 illustrates the first through third laser module units 201, 203, and 205 being arranged in a vertical direction, the first through third laser module units 201, 203, and 205 may be arranged in a different direction. Furthermore, while in the above description indicates that the first through third laser module units 201, 203, and 205 may respectively emit red, blue, and green light, the laser module units 201, 203, and 205 may emit light of different wavelengths. The laser module 200 may also include two laser module units or four laser module units, for example. In other words, the laser module 200 is not limited to including three laser module units.

As shown in FIG. 7, the light scanning unit scans light emitted by the laser module 200 to create a planar image D on the screen 250. The light scanning unit may include a cylindrical lens module 210, a linear reflective panel 220, and a scanning mirror 241. The cylindrical lens module 210 may shape incident light emitted by the laser module 200 into light having a linear cross-section. Referring to FIG. 7, if the laser module 200 includes first through third laser module units 201, 203, and 205, the cylindrical lens module 210 includes the first through third cylindrical lenses 211, 213, and 215 that are disposed in paths along which laser beams emitted by the first through third laser module units 201, 203, and 205 propagate. As such, the first through third cylindrical lenses 211, 213, and 215 shape the respective laser beams emitted from the first through third laser module units 201, 203, and 205 into a desired profile.

Referring to FIG. 7, the linear reflective panel 220 is disposed between the cylindrical lens module 210 and the scanning mirror 241. The linear reflective panel 220 may reflect the incident linearly-shaped light independently for each pixel to create a linear primary image C. As such, the linear reflective panel 220 may be arranged in a path along which the linearly-shaped light is incident and may have multiple digital micro-mirror devices (DMDs), each corresponding to one pixel of a linear primary image C.

As shown in the example embodiment of FIG. 7, if the laser module 200 includes first through third laser module units 201, 203, and 205, the linear reflective panel 220 may include first through third linear reflective panels 221, 223, and 225 that are disposed in paths along which beams shaped by the first through third cylindrical lenses 211, 213, and 215 propagate.

Still referring to FIG. 7, the scanning mirror 241 may rotate due to a driving force provided by a driving source 245. As such, the scanning mirror 241 may perform a vertical line scan on the linear primary image C created by the linear reflective panel 220 in order to create the planar image D on the screen 250.

As described above, an example embodiment of a laser display may include a laser module that allows direct modulation of a laser beam output, and thus may provide a full-color image without using a separate light modulator.

Figure 8:
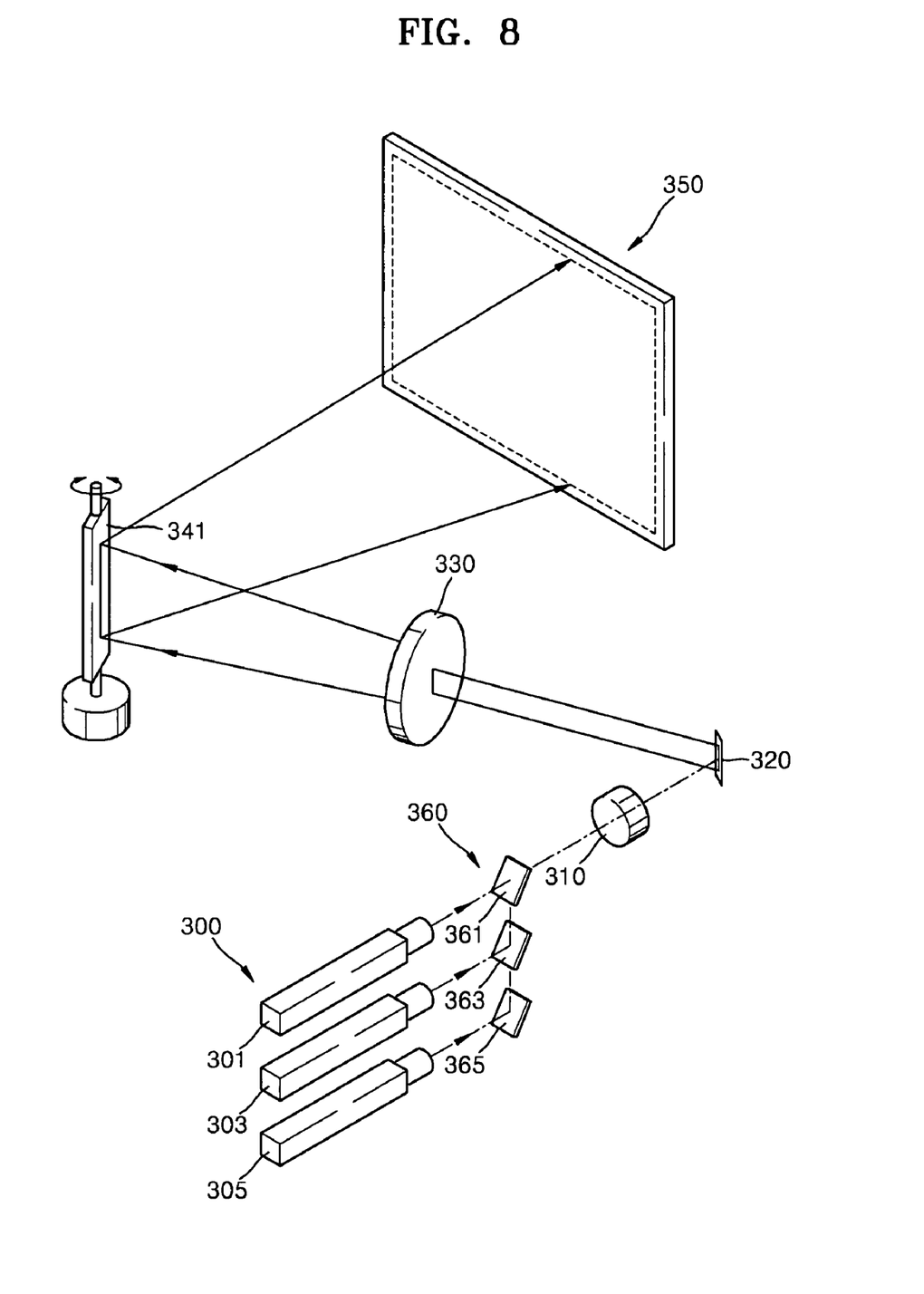
FIG. 8 is a diagram illustrating the optical arrangement of another example embodiment of a laser display employing a laser module allowing direct light modulation.

FIG. 8 illustrates an example optical arrangement of a laser display employing a laser module allowing direct light modulation according to another example embodiment.

Referring to FIG. 8, the laser display may display an image by scanning a laser beam onto a screen 350. The laser display may include a laser module 300 emitting an optically modulated laser beam, a light scanning unit, and a projection optical system 330 disposed between the laser module 300 and the screen 350 that enlarges and projects light onto the screen 350.

The laser module 300 having a structure that allows direct light modulation, as described above, may emit a laser beam corresponding to an image to be projected onto the screen 350. In FIG. 8, the laser module 300 includes first through third laser module units 301, 303, and 305 respectively emitting red, blue, and green laser beams to realize a color display. Because the laser module 300 has substantially the same construction as the laser module 200 shown in FIG. 7, a detailed explanation is omitted herein for the sake of brevity.

The light scanning unit of FIG. 8 may scan light emitted by the laser module 300 to create a planar image onto the screen 350. To achieve this function, the light scanning unit may include a cylindrical lens module 310, a linear reflective panel 320, and a scanning mirror 341. The cylindrical lens 310 may shape incident light emitted by the laser module 300 into light having a linear cross-sectional shape. The linear reflective panel 320 may be disposed between the cylindrical lens 310 and the scanning mirror 341 and may reflect the incident linearly-shaped light independently for each pixel to create a linear primary image according to an example embodiment.

Unlike the cylindrical lens module 210 and the linear reflective panel 220 of the laser display of FIG. 7, the cylindrical lens 310 and the linear reflective panel 320 include a single component even when a full-color image is realized.

The example embodiment of the laser display shown in FIG. 8 includes a light path converting unit 360. The light path converting unit 360 causes laser beams emitted by the first through third laser module units 301, 303, and 305 to propagate along the same path. The example light path converting unit 360 of FIG. 8 is disposed between the cylindrical lens 310 and the first through third laser module units 301, 303, and 305. The example light path converting unit 360 includes first and second beam splitters 361 and 363 and a single reflective mirror 365. The first beam splitter 361 transmits a laser beam of a desired and/or predetermined wavelength emitted by the first laser module unit 301, for example, a red laser beam, while reflecting laser beams of desired and/or predetermined wavelengths emitted by the second and third laser modules 303 and 305, for example, blue and green laser beams, respectively. Thus, in the example of FIG. 8, the first beam splitter 361 directs all the laser beams emitted by the first through third laser modules 301, 303, and 305 towards the cylindrical lens 310. Further, the second beam splitter 363 reflects a laser beam of a desired and/or predetermined wavelength emitted by the second laser beam 303, for example, a blue laser beam, while reflecting a laser beam of a desired and/or predetermined wavelength emitted by the third laser module 305, for example, a green laser beam. Thus, the second beam splitter 363 reflects the laser beams emitted by the second and third laser modules 303 and 305 toward the first beam splitter 361. Still further, the reflective mirror 365 is disposed between the third laser module 305 and the second beam splitter 363 and reflects a laser beam of a desired and/or predetermined wavelength emitted by the third laser module 305, for example, a green laser beam, toward the second beam splitter 363.

The first and second beam splitters 361 and 363 and the reflective mirror 365 in the light path converting unit 360 may have different functions and be arranged in various other configurations according to alternative embodiments. For example, the light path converting unit 360 may combine laser beams emitted by the first through third laser modules 301, 303, and 305 together and direct the resulting beam towards the cylindrical lens 310.

Since the projection optical system 330 and the scanning mirror 341 of the laser display of FIG. 8 have substantially the same functions and configurations as their counterparts in the laser display of FIG. 7, a detailed description thereof is omitted for the sake of brevity.

As described above, a laser display according to an example embodiment uses a laser module allowing direct modulation of a laser beam output, thus achieving a full-color image without using a separate light modulator. The laser display may also include a light path converting unit to allow propagation of laser beams along a single path. Thus, according to an example embodiment, a full-color image can be provided through the use of a single cylindrical lens and a linear reflective panel, thereby achieving a compact design.

As described above, an example embodiment of a laser module uses an external cavity laser and a non-linear optical element to allow direct light modulation. An example embodiment of a laser module may also provide high wavelength conversion efficiency by converting high power light from the external cavity laser using the non-linear optical element as well as coupling in the non-linear optical element through a simple optical system. Furthermore, because primary light emitted by the external cavity laser generally has a round symmetric profile, coupling loss can be minimized. An example embodiment of the laser module may enable uniform wavelength control due to low sensitivity to temperature variations, thus obtaining uniform output power of primary light and visible light. As such, an example embodiment of the laser module may allow easy control of the power of primary light and visible light by improving the structure of a semiconductor chip. Furthermore, an example embodiment of a laser module does not require a complicated fabrication process like a DFB or Nd:YAG laser, thus significantly increasing productivity.

Using an example embodiment of a laser module that allows direct light modulation as a light source for a display eliminates the need for additional light modulation elements, thus providing a simple and compact laser display.

While example embodiments have been particularly shown and described above with reference to the FIGS. 1-8, it will be understood by those of ordinary skill in the art that various changes in form and details may be made therein without departing from the spirit and scope of the present invention as defined by the following claims.

What is claimed is:

1. A laser module allowing direct light modulation, comprising:
   a semiconductor chip including an active layer generating light of primary wavelength and a reflective layer reflecting outwards light generated in the active layer;
   a Volume Bragg Grating (VBG) that is disposed opposite the active layer and repeatedly reflects light with the specific wavelength emitted from the active layer toward the reflective layer to amplify light and outputs the amplified light;
   a pump laser supplying pump light in order to excite the active layer; and
   a non-linear optical element that is disposed outside a cavity between the VBG and the semiconductor chip to convert light of the primary wavelength emitted from the active layer into light of a different wavelength than the primary wavelength.

2. The module of claim 1, wherein the pump laser is disposed behind the semiconductor chip.

3. The module of claim 2, further comprising a heat sink mounted on a rear surface of the semiconductor chip.

4. The module of claim 1, wherein the non-linear optical element is formed of a Periodically-Poled Second Harmonic Generation (PP-SHG) material.

5. The module of claim 4, wherein the non-linear optical element is formed of one of PP $LiNbO_3$ (PPLN) and PP $LiTaO_3$ (PPLT).

6. The module of claim 4, wherein the non-linear optical element has a waveguide configuration.

7. The module of claim 1, further comprising one of a Brewster plate and polarization filter disposed in an optical path between the semiconductor chip and the VBG.

8. The module of claim 1, further comprising a folding mirror disposed in an optical path between the semiconductor chip and the VBG.

9. The module of claim 1, wherein the primary wavelength is within a range of about 900 nm to about 1,300 nm.

10. The module of claim 1, wherein the light of the different wavelength is within a range of about 450 nm to about 650 nm.

11. The module of claim 1, further comprising one of a spherical lens, an aspheric lens, and a Graded Refractive Index (GRIN) lens disposed between the VBG and the non-linear optical element.

12. A laser display for displaying an image by scanning laser light onto a screen, the laser display comprising:
    at least one laser module of claim 1 providing the laser light;
    a light scanning unit scanning the laser light emitted by the laser module to the screen;
    a projection optical system disposed between the laser module and the screen, the projection optical system enlarging and projecting the laser light onto the screen.

13. The display of claim 12, wherein the pump laser is disposed behind the semiconductor chip.

14. The display of claim 12, wherein the non-linear optical element is formed of a Periodically-Poled Second Harmonic Generation (PP-SHG) material.

15. The display of claim 14, wherein the non-linear optical element is formed of one of PP $LiNbO_3$ (PPLN) and PP $LiTaO_3$ (PPLT).

16. The display of claim 15, wherein the non-linear optical element has a waveguide shape.

17. The display of claim 12, wherein the laser module further comprises one of a Brewster plate and polarization filter disposed in an optical path between the semiconductor chip and the VBG.

18. The display of claim 12, wherein the primary wavelength is within a range of about 900 nm to about 1,300 nm.

19. The display of claim 18, wherein light output through the non-linear optical element has a wavelength within a range of about 450 nm to about 650 nm.

20. The laser display of claim 12, wherein the at least one laser module is a plurality of laser modules, each outputting a laser light with a different wavelength.

21. The laser display of claim 20, wherein each output laser light is provided to the projection optical system via a respective lens and a respective reflection panel.

* * * * *